United States Patent
Burke et al.

(10) Patent No.: US 7,682,935 B2
(45) Date of Patent: Mar. 23, 2010

(54) PROCESS OF MANUFACTURE OF ULTRA THIN SEMICONDUCTOR WAFERS WITH BONDED CONDUCTIVE HARD CARRIER

(75) Inventors: Hugo R. G. Burke, PontyClun (GB); David Paul Jones, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 553 days.

(21) Appl. No.: 11/449,505

(22) Filed: Jun. 8, 2006

(65) Prior Publication Data
US 2006/0281315 A1 Dec. 14, 2006

Related U.S. Application Data

(60) Provisional application No. 60/688,453, filed on Jun. 8, 2005.

(51) Int. Cl.
*H01L 21/30* (2006.01)
*H01L 21/46* (2006.01)

(52) U.S. Cl. .................. 438/459; 438/197; 438/753; 257/E21.237; 257/E21.411; 257/E21.421; 257/E29.723

(58) Field of Classification Search .......... 438/459, 438/106, 113, 114, 197, 460, 687, 688, 753
See application file for complete search history.

(56) References Cited

U.S. PATENT DOCUMENTS

| 5,047,833 | A  | * | 9/1991  | Gould ........................ 257/772 |
| 5,324,687 | A  | * | 6/1994  | Wojnarowski .............. 438/107 |
| 6,465,353 | B1 | * | 10/2002 | Francis ....................... 438/690 |
| 6,506,664 | B1 | * | 1/2003  | Beyne et al. ................ 438/455 |
| 6,624,522 | B2 | * | 9/2003  | Standing et al. ............ 257/782 |

* cited by examiner

*Primary Examiner*—David Nhu
(74) *Attorney, Agent, or Firm*—Farjami & Farjami LLP

(57) ABSTRACT

A process is described to enable the manufacture of a thinned (<50 μm semiconductor die) which can employ the use of standard equipment for the manufacture of the wafer and the packaging of the die singulated from the wafer. A standard thickness wafer (350 μm) first has junctions formed in its upper surface, but the surface is not yet metallized and patterned. A rigid front plate is connected to the upper surface by a removable adhesive and the wafer is back ground to its final thickness, for example, less than 50 μm. A back metal and a thick conductive backing plate are then fixed to the back metal. The rigid front plate is then removed and the front surface of the wafer is metallized and patterned. Die singulated from the wafer carry the thick permanent conductive backing plate and may be conventionally packaged as prior art 350 μm die. The wafer can initially be partially diced.

21 Claims, 4 Drawing Sheets

PROCESS OF MANUFACTURE OF ULTRA THIN SEMICONDUCTOR WAFERS WITH BONDED CONDUCTIVE HARD CARRIER

RELATED APPLICATIONS

This application claims the benefit and priority of U.S. Provisional Application No. 60/688,453, filed Jun. 8, 2005 the entire disclosure of which is incorporated by reference herein.

FIELD OF THE INVENTION

This invention relates to the manufacture of ultrathin semiconductor wafers and die and to the packaging of such die.

BACKGROUND OF THE INVENTION

Ultra thin semiconductor die which are thinner than about 100 µm are well known. Such die can be formed as vertical conduction MOSFETs or other semiconductor devices with a very low on resistance ($R_{DSON}$).

However, when such wafers are thinned to below about 100 µm, they are very fragile and hard to handle in present day fabrication and packaging equipment.

The present invention provides a novel process for the handling of such die and their subsequent packaging in conventional packaging equipment.

BRIEF SUMMARY OF THE INVENTION

In accordance with the invention the front or top surface of a full thickness die is conventionally processed to receive the requisite junctions but without the formation of the front metal and the front metal patterning. A thick rigid front carrier plate is then adhesively applied to the unmetallized front surface with an adhesive that can be easily dissolved.

The back side of the wafer is then ground back to some desired thickness, for example, to less than 50 µm. After a conventional stress relief process, a suitable back metal which becomes, for example, the drain electrode of thinned MOSFETs, is applied to the wafer back surface as by sputtering or the like.

A relatively thick and rigid conductive back plate, which may be copper, aluminum or other conductive material is then permanently conductively bonded to the back metal, and the front carrier plate is removed by disabling the adhesive.

The front surface of the thinned wafer is then metallized and patterned with the thick conductive back plate providing rigidity to enable the easy handling of the die.

The wafer may then be mounted and sawn (or singulated) into separate die. The conductive back plate is an integral part of the singulated die which has the thinned silicon die fixed thereto to provide physical strength to the assembly and to further reduce $R_{DSON}$.

The individual die assemblies can now be handled as conventional thick die for mounting in a can such as a DirectFET package (U.S. Pat. No. 6,624,522) or in any other package.

It will be noted also that there is no front metal induced stress on the thinned silicon until after the backside conductor has been bonded to the wafer. Further, front metal features cannot pattern through to the wafer back during the grind-to-thin operation. Further, higher temperature bonding for the adhesive and for connecting the thick back plate to the silicon can be used since the front metal is not yet in place.

As a further feature of the invention, the wafer can be diced before grinding. With this embodiment, the glue used to bond the front carrier plate will flow into the saw lines and prevent the back metal and back plate bonding material from going up the die side walls.

DETAILED DESCRIPTION OF THE DRAWINGS

Figure 1:
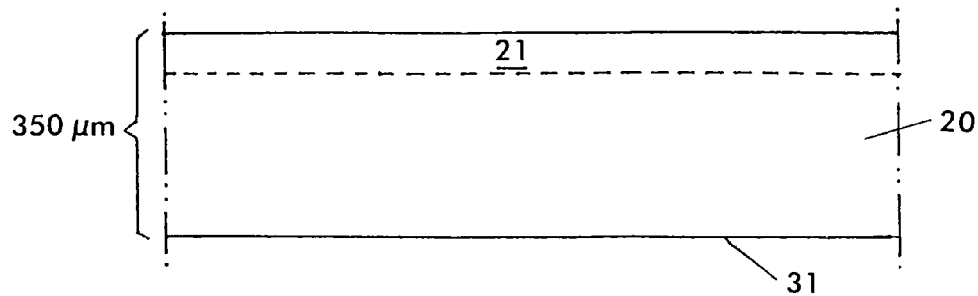
FIG. 1 is a cross-section of a small portion of a semiconductor wafer of conventional thickness after the processing of its upper surface to form device junctions in standard wafer processing equipment.

FIG. 1 is cross-section of a full thickness silicon wafer 20 which may, for example, be 350 µm thick and is suitable for processing in conventional semiconductor wafer processing equipment. Thus, the top surface 21 of the wafer is completely processed in conventional equipment to form a suitable junction pattern which may be planar or trench (not shown) for a conventional vertical conduction type MOSFET or any other type of device. However, the front metal is not yet applied and patterned.

Figure 2:
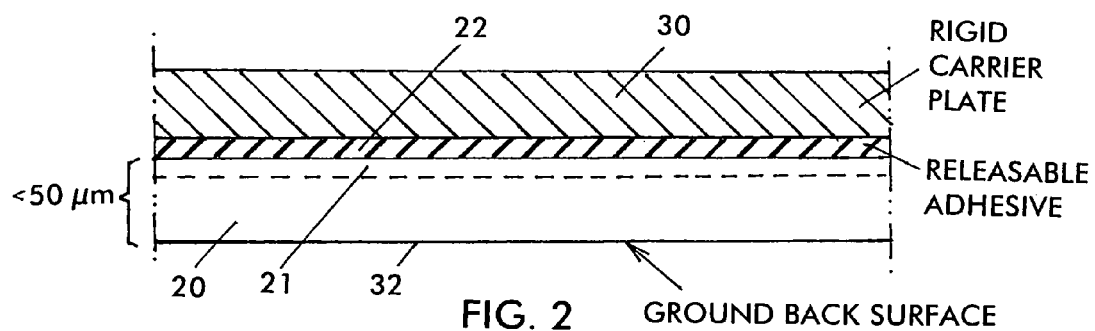
FIG. 2 shows the wafer of FIG. 1 after the connection of a rigid front carrier plate to the wafer upper surface and after a back surface grind to thin the wafer while reinforced by the front carrier plate.

A rigid front side carrier 30 is then glued or otherwise releasably adhered to the front side 21 (which is not yet metallized) as shown in FIG. 2. The glue 22 employed is selected to be one which can be easily dissolved or deactivated to permit later removal.

The back side 31 of the wafer 20 of FIG. 1 is then ground back to surface 32 in FIG. 2 and to the desired final wafer thickness, for example, less than about 50 µm. The front side carrier 30 provides the physical strength to enable this grind without damage to semiconductor wafer 20.

Figure 3:
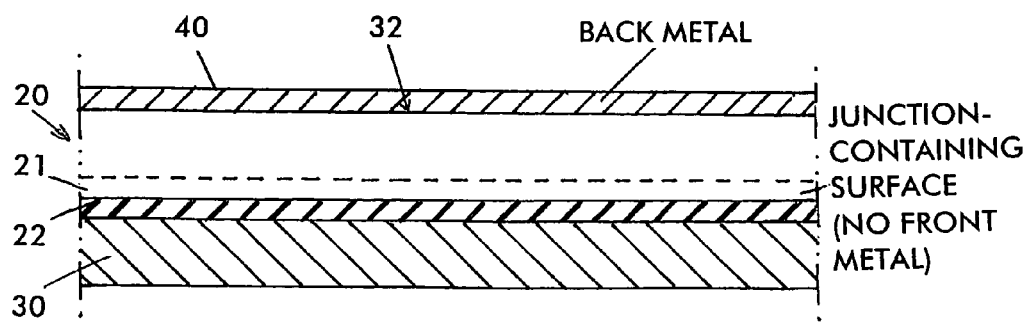
FIG. 3 shows the wafer of FIG. 2 after the application of a back metal eutectic to the ground back surface.

The thinned wafer 20 with carrier 30 is next processed to have a back metal 40 applied thereto, as by a conventional sputter process, as shown in FIG. 3. A Ti/Ni/Ag contact may be used.

Figure 4:
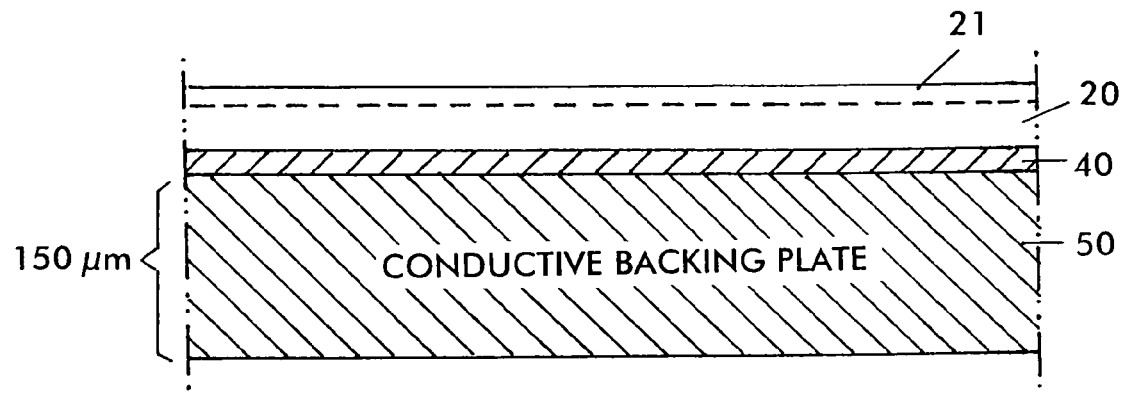
FIG. 4 shows the wafer of FIG. 3 after the application of a thick conductive backing plate and the subsequent removal of the front side carrier plate.

Thereafter, and as shown in FIG. 4, a thick sturdy backing plate 50, which may be of aluminum about 150 µm thick, or copper or any other desired conductive material is permanently conductively attached to back metal 40 as by a solder or conductive epoxy adhesive. The front side carrier 30 is then removed.

Figure 5:
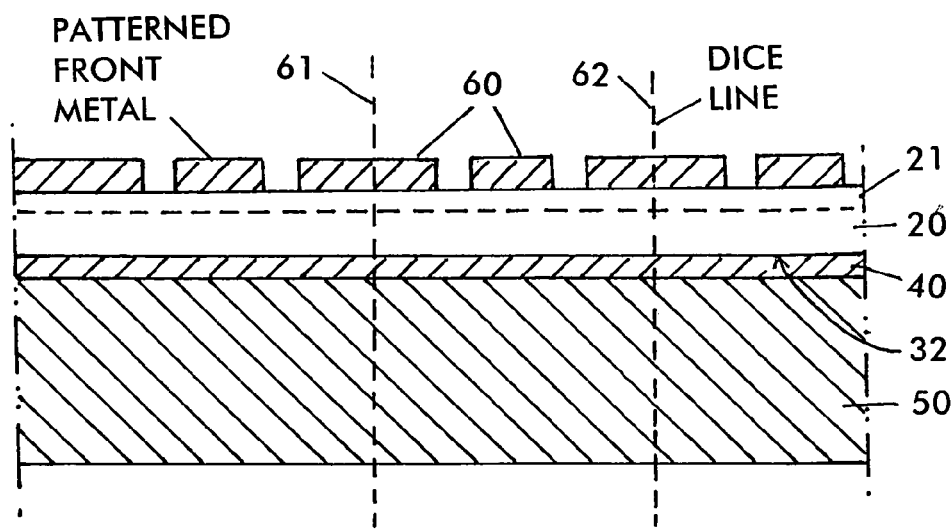
FIG. 5 shows the wafer of FIG. 4 after the deposition of a front metal which an be conventionally patterned to complete the semiconductor die in the wafer.

As next shown in FIG. 5, the front side metal 60, such as aluminum, is applied to the exposed front side surface 21 and is suitable patterned (not shown) for example, to define source and gate contacts for each of a plurality of die locations.

The back metal plate 50 will now serve as a permanent support for the wafer during dicing at vertical dotted lines 61, 62 (die separation by sawing or the like) and for packaging of the die. Conventional packaging equipment can be used for the thick, strong die assembly.

Figure 6:
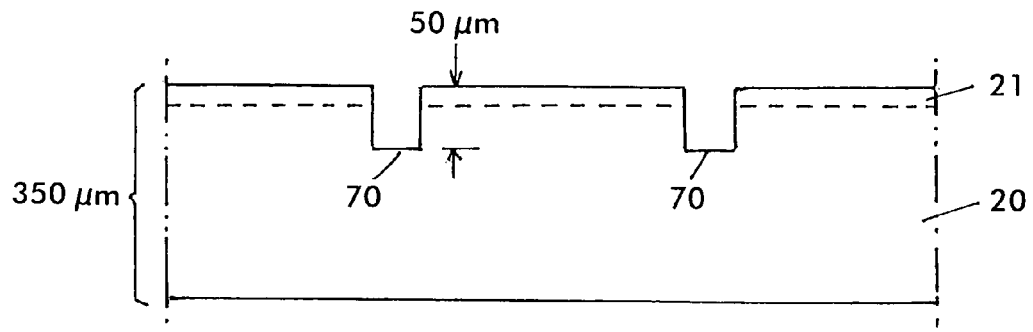
FIG. 6 shows second embodiment of the invention in which the wafer of FIG. 1 is partially sawn or diced prior to the application of the front carrier plate and the back grind.

FIG. 6 is a cross-section like that of FIG. 5, where however, the wafer with plural die 20 location is diced with shallow trenches 70 before the second metal and before the grind operation. This will produce, in effect, an integral metal can with effective vias as will be seen.

Figure 7:
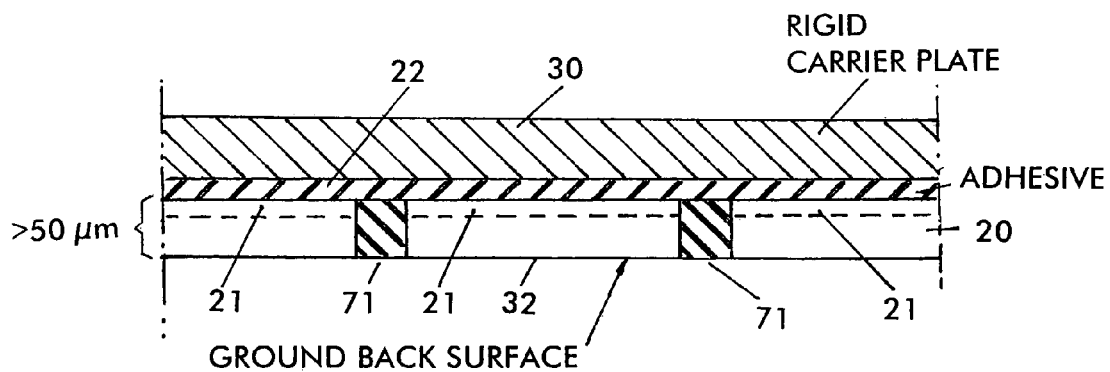
FIG. 7 shows the wafer of FIG. 6 after the application of the front carrier plate and the back grind.

FIG. 7 is a cross-section showing the wafer 20 of FIG. 6 after attachment of carrier plate. The diced space 70 is filled with an insulation resin 71 ("FSC") to prevent metallizing 40 from seeping into the opened area.

Figure 8:
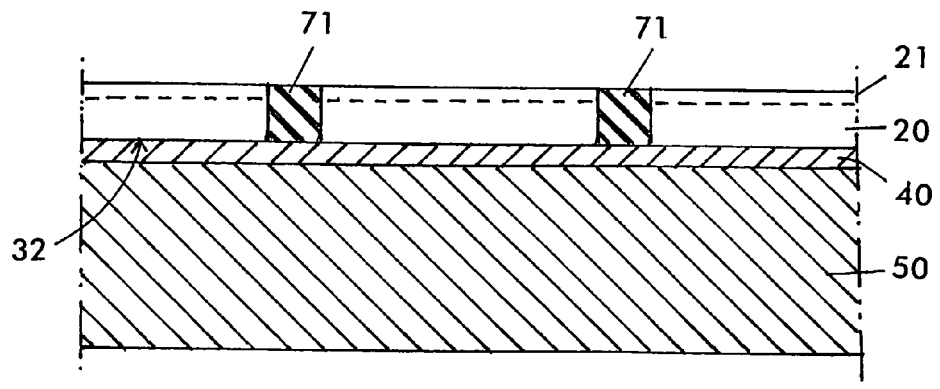
FIG. 8 shows the wafer of FIG. 7 after the steps of FIGS. 3 and 4.

Thereafter, as shown in FIG. 8, back metal plate 50 is added and carrier plate 50 is removed.

Figure 9:
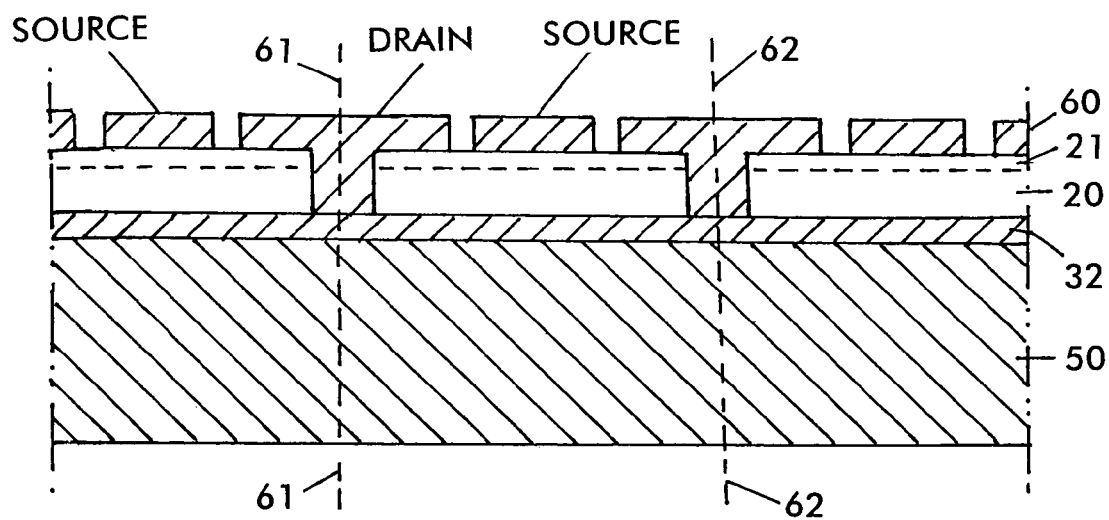
FIG. 9 shows the wafer of FIG. 8 after the front metal deposition and patterning of FIG. 5.

Thereafter, as shown in FIG. 9, a clean step to clean the metal removes the resin 70 and the top metal 60 is connected to the bottom metal 60 (drain) and carrier 50.

The metal 60 is then patterned as shown in FIG. 9 to separate the source and drain contacts. Further contact materials (Connectron) may be applied.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for manufacturing semiconductor devices with ultra thin semiconductor dies, comprising:
   a) forming a junction pattern in a top surface of a semiconductor wafer;
   b) adhering with a releasable adhesive a rigid carrier plate to said top surface after said junction pattern is formed;
   c) back grinding said semiconductor wafer to reduce its thickness to a predetermined thickness, said back grinding resulting in a back surface;
   d) forming a back metal contact on said back surface;
   e) permanently securing a conductive backing plate to said back metal contact;
   f) removing said rigid carrier plate and releasable adhesive from said top surface of said semiconductor wafer;
   g) applying and patterning a top metal to said top surface of said semiconductor wafer and to said junction pattern; and
   h) dicing said semiconductor wafer into a plurality of die.

2. The process for manufacturing semiconductor devices with ultra thin semiconductor dies according to claim 1, wherein said semiconductor wafer is comprised of silicon.

3. The process for manufacturing semiconductor devices with ultra thin semiconductor dies according to claim 1, wherein said semiconductor wafer has a thickness of about 350 µm.

4. The process for manufacturing semiconductor devices with ultra thin semiconductor dies according to claim 1, wherein said semiconductor wafer is reduced to a thickness less than about 50 µm.

5. The process for manufacturing semiconductor devices with ultra thin semiconductor dies according to claim 3, wherein said semiconductor wafer is reduced to a thickness less than about 50 µm.

6. The process for manufacturing semiconductor devices with ultra thin semiconductor dies according to claim 5, wherein said semiconductor wafer is comprised of silicon.

7. The process for manufacturing semiconductor devices with ultra thin semiconductor dies according to claim 1, wherein said backing plate is one of copper or aluminum.

8. The process for manufacturing semiconductor devices with ultra thin semiconductor dies according to claim 7, wherein said backing plate has a thickness of about 150 µm.

9. The process for manufacturing semiconductor devices with ultra thin semiconductor dies according to claim 7, wherein said semiconductor wafer has a thickness of about 350 µm.

10. The process for manufacturing semiconductor devices with ultra thin semiconductor dies according to claim 7, wherein said semiconductor wafer is thinned to a thickness less than about 50 µm.

11. The process for manufacturing semiconductor devices with ultra thin semiconductor dies according to claim 8, wherein said semiconductor wafer has a thickness of about 350 µm.

12. The process for manufacturing semiconductor devices with ultra thin semiconductor dies according to claim 8, wherein said semiconductor wafer is thinned to a thickness less than about 50 µm.

13. The process for manufacturing semiconductor devices with ultra thin semiconductor dies according to claim 10, wherein said semiconductor wafer is comprised of silicon.

14. The process for manufacturing semiconductor devices with ultra thin semiconductor dies according to claim 12, wherein said semiconductor wafer is comprised of silicon.

15. The process for manufacturing semiconductor devices with ultra thin semiconductor dies according to claim 1, which further includes a partial dicing into the surface of said semiconductor wafer for a depth at least equal to the thickness of said semiconductor wafer after said back grinding.

16. The process for manufacturing semiconductor devices with ultra thin semiconductor dies according to claim 15, wherein said semiconductor wafer is comprised of silicon.

17. The process for manufacturing semiconductor devices with ultra thin semiconductor dies according to claim 15, wherein said semiconductor wafer has a thickness of about 350 µm.

18. The process for manufacturing semiconductor devices with ultra thin semiconductor dies according to claim 15, wherein said semiconductor wafer is reduced to a thickness less than about 50 µm.

19. The process for manufacturing semiconductor devices with ultra thin semiconductor dies according to claim 17, wherein said semiconductor wafer is reduced to a thickness less than about 50 µm.

20. The process for manufacturing semiconductor devices with ultra thin semiconductor dies according to claim 15, wherein said backing plate is one of copper or aluminum.

21. The process for manufacturing semiconductor devices with ultra thin semiconductor dies according to claim 20, wherein said backing plate has a thickness of about 150 µm.

* * * * *